United States Patent [19]
Ichihara

[11] Patent Number: 5,684,687
[45] Date of Patent: Nov. 4, 1997

[54] DRIVER CIRCUIT FOR INVERTER

[75] Inventor: Takao Ichihara, Mie, Japan

[73] Assignee: Fuji Electric Co., Ltd., Kawasaki, Japan

[21] Appl. No.: 570,469

[22] Filed: Dec. 11, 1995

[30]  Foreign Application Priority Data

Dec. 15, 1994 [JP] Japan ................................. 6-311435

[51] Int. Cl.$^6$ ...................................... H02M 3/24
[52] U.S. Cl. ............................................. 363/97
[58] Field of Search ........................ 363/97, 131–132, 363/139, 135, 137

[56]  References Cited

U.S. PATENT DOCUMENTS 5,572,418  11/1996  Kimura et al. ............................. 363/97

*Primary Examiner*—Aditya Krishnan
*Attorney, Agent, or Firm*—Kanesaka & Takeuchi

[57]  ABSTRACT

A driver circuit for an inverter includes a switching circuit formed of a first switching element and a second switching element connected in series, which are turned on and off in complementary with one another; a first DC power supply connected parallel to the switching circuit; a first driver circuit connected to the first switching element for driving the same; a second driver circuit connected to the second switching element for driving the same; a second DC power supply connected to the second driver circuit for supplying electric power to the second driver circuit; and a first capacitor connected to the first driver circuit and having a charge-up path communicating with the second DC power supply. During an ON-period of the second switching element, the first capacitor is charged up through the second DC power supply and supplies electric power to the first driver circuit. A series circuit formed of a PNP transistor and a diode and are disposed in the charge-up path, and a resistor is connected between a base of the PNP transistor and a negative terminal of the second DC power supply. The second DC power supply can rise smoothly.

6 Claims, 4 Drawing Sheets

VOLTAGE OF FIRST DC POWER SUPPLY

VOLTAGE OF SECOND DC POWER SUPPLY

BASE CURRENT OF PNP TRANSISTOR

DRIVE SIGNAL OF
SECOND SWITCHING
ELEMENT

CHARGE-UP CURRENT
OF FIRST CAPACITOR

VOLTAGE ACROSS
FIRST CAPACITOR

DRIVE SIGNAL OF
SECOND SWITCHING
ELEMENT

//5,684,687

DRIVER CIRCUIT FOR INVERTER

BACKGROUND OF THE INVENTION AND RELATED ART STATEMENT

The present invention relates to a driver circuit for an inverter, and more specifically the present invention relates to a charge pump type power supply circuit used as a power supply in a driver circuit for driving switching elements of an inverter.

FIG. 6 is a circuit diagram showing a half of a bridge circuit adopted in a conventional driver circuit for an inverter.

In FIG. 6, the reference numeral 1 designates a first DC power supply; 2 is a second DC power supply; 4 is a diode; 5 is a first capacitor; 6 is a first driver circuit; 7 is a second driver circuit; 8 is an insulated gate bipolar transistor (hereinafter referred to as "IGBT") as a first switching element; and 9 is an IGBT as a second switching element.

The second DC power supply 2 is fed with a desired voltage from a DC-DC converter or the like, not shown in FIG. 6, that converts the power supplied from the first DC power supply 1 to the desired voltage to be insulated from the first DC power supply 1. The second DC power supply 2 supplies electric power to the second driver 7.

The first capacitor 5 pumps up or receives electric charges from the second DC power supply 2 through the diode 4 when the IGBT 9 is ON. The first capacitor 5 stores the electric charges so as to function as a power supply of the first driver circuit 6. This way of obtaining a power supply is called "charge pump scheme" or "bootstrap scheme".

FIG. 7(a) is a wave form of a drive signal for driving the second switching element 9. FIG. 7(b) is a wave form of a charge-up current of the first capacitor 5. And, FIG. 7(c) is a wave form of the voltage across the first capacitor 5.

In the conventional driver circuit described above, in case the capacitor 5 as shown in FIG. 7(c) has not been charged up yet or the charge amount stored therein is small, when the IGBT 9 as shown in FIG. 7(a) is turned on to charge up the capacitor 5 with the voltage of the DC power supply 2, a too high charge-up current flows as shown in FIG. 7(b), so that the voltage of the second DC power supply 2 becomes unstable, or the over charge-up current described above drives a protection circuit of the DC-DC converter described above to stop the operation of the driver circuit of the inverter. To solve these problems, it is necessary to control the duty of the charge-up current of the first capacitor 5 at the initial charging by feeding to the second driver circuit 7 of the IGBT 9 an ON-OFF signal having a specific pattern shown in FIG. 8. This counter measure inevitably requires a complicated circuit for controlling the duty of the charge-up current of the capacitor 5.

In Japanese Patent Publication (KOKAI) No. 4-138068, a driver circuit similar to FIG. 6 is disclosed. Also, Japanese Patent Publication (KOKOKU) No. 5-84151 (KOKAI No. 60-70980) discloses a similar driver circuit with a capacitor and a diode.

It is an object of the invention to provide a simple driver circuit for an inverter to obviate the above problems and to facilitate smoothly raising of the voltage of the second DC power supply.

SUMMARY OF THE INVENTION

According to the present invention, there is provided a driver circuit for an inverter that comprises: a switching circuit including a first switching element and a second switching element, which are connected in series and turned on and off in complementary with one another; a first DC power supply connected parallel to the switching circuit; a first driver circuit for driving the first switching element; a second driver circuit for driving the second switching element; a second DC power supply for supplying electric power to the second driver circuit; and a first capacitor for supplying electric power to the first driver circuit. The first capacitor supplies electricity to the first driver circuit by charging-up from the second DC power supply during the ON-period of the second switching element.

In a first aspect of the invention, the circuit includes a series circuit having a PNP transistor and a diode, the series circuit being disposed in a charge-up path from the second DC power supply to the first capacitor; and a resistor connected between the base of the PNP transistor and the negative terminal of the second DC power supply.

In a second aspect of the invention, the circuit includes a diode disposed in a charge-up path from the second DC power supply to the first capacitor; a PNP transistor connected between the positive terminal of the second DC power supply and a common connection point of the charge-up path and a power supply path for the second driver circuit; and a resistor connected between the base of the PNP transistor and the negative terminal of the second DC power supply.

In a third aspect of the invention, the circuit includes a diode disposed in a charge-up path from the second DC power supply to the first capacitor; a PNP transistor connected between the positive terminal of the second DC power supply and a common connection point of the charge-up path and a power supply path for the second driver circuit; a resistor connected between the base of the PNP transistor and the negative terminal of the second DC power supply; and a second capacitor connected between the emitter terminal and the base terminal of the PNP transistor.

In a fourth aspect of the invention, it is preferable to turn on the second switching element during a predetermined period at the initial charge-up of the first capacitor.

In the first aspect of the invention, the charge-up current of the first capacitor is kept at a constant value by the PNP transistor disposed in the charge-up path of the first capacitor and by the base resistance of the PNP transistor. The charge-up current is kept at a constant value until the voltage across the first capacitor becomes almost equal to the voltage of the second DC power supply charging the first capacitor.

In the second aspect of the invention, since the current flowing to the first capacitor and the second driver circuit is suppressed by the PNP transistor and its base resistance while the voltage of the second DC power supply is rising, it is possible to smoothly raise the voltage of the second DC power supply.

In the third aspect of the invention, current is prevented from flowing to the first capacitor and the second driver circuit by the PNP transistor, the base resistance of the PNP transistor and the second capacitor connected between the base and emitter terminals of the PNP transistor while the voltage of the second DC power supply is rising. Thus, the current flows to the first capacitor and the second driver circuit with limited value, which is not more than the value when the voltage of the second DC power supply has risen. Therefore, it is possible to smoothly raise the voltage of the second DC power supply.

In the fourth aspect, the second switching element may be turned on during a predetermined period at the initial charge-up of the first capacitor by a simple circuit.

DETAILED DESCRIPTION OF PREFERRED EMBODIMENTS

Figure 6:
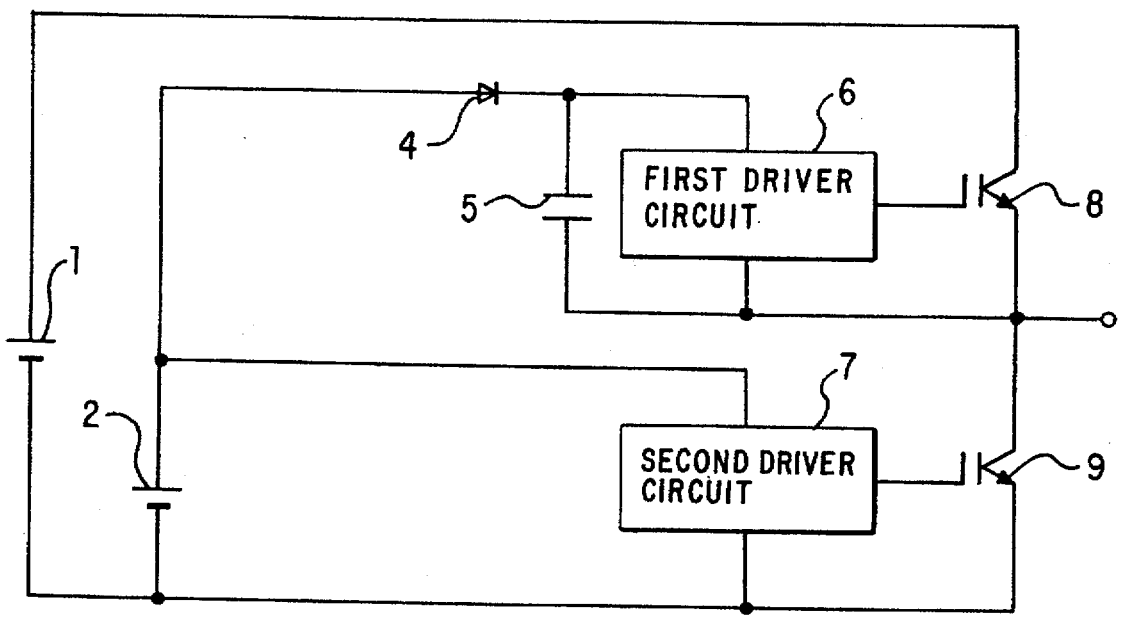
FIG. 6 is a circuit diagram showing a half of a bridge circuit in a conventional driver circuit for an inverter.
Figure 7A:
FIG. 7(a) is a wave form of a drive signal for driving a second switching element of FIG. 6.
Figure 7B:
FIG. 7(b) is a wave form of a charge-up current of a first capacitor of FIG. 6.
Figure 7C:
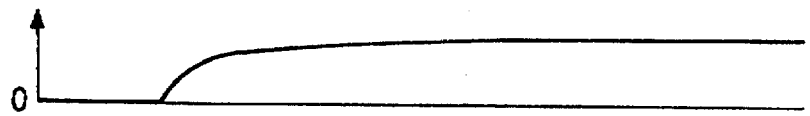
FIG. 7(c) is a wave form of a voltage across the first capacitor 5 of FIG. 6.
Figure 8:
FIG. 8 is a wave form of an ON-OFF signal fed to a second driver circuit for controlling duty of a charge-up current of the first capacitor of FIG. 6.

Now the present invention will be explained hereinafter with reference to the accompanied drawings which illustrate the preferred embodiments of the invention. In the following description of the embodiments, parts similar to those of the prior art of FIG. 6 are designated by the same reference numerals and their explanations are omitted.

Figure 1:
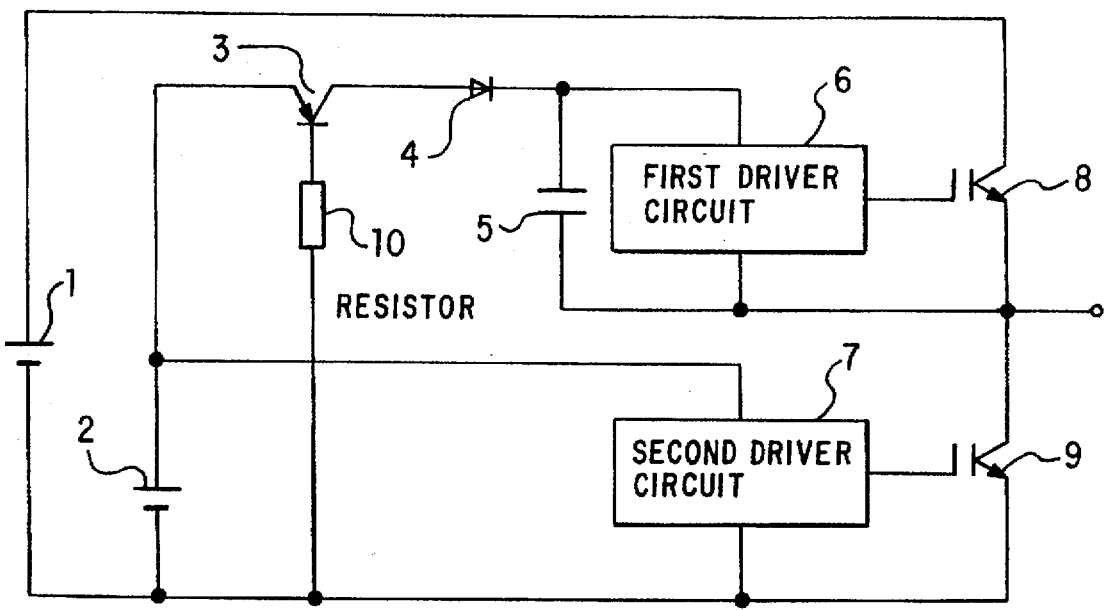
FIG. 1 is a circuit diagram of a first embodiment of a driver circuit for an inverter according to the present invention.
Figure 2A:
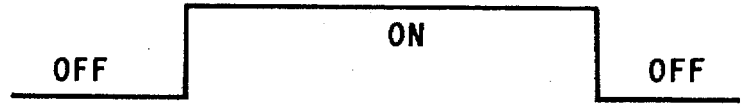
FIG. 2(a) is a wave form of a drive signal for driving a second switching element of FIG. 1.
Figure 2B:
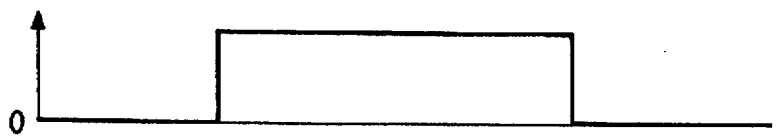
FIG. 2(b) is a wave form of a charge-up current of a first capacitor of FIG. 1.
Figure 2C:
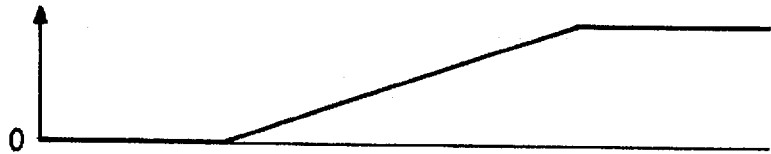
FIG. 2(c) is a wave form of a voltage across the first capacitor of FIG. 1.

FIG. 1 is a circuit diagram of a first embodiment of a driver circuit for an inverter according to the present invention. FIG. 2(a) is a wave form of a drive signal for driving a second switching element 9 of FIG. 1. FIG. 2(b) is a wave form of a charge-up current of a first capacitor 5 of FIG. 1. And, FIG. 2(c) is a wave form of a voltage across the first capacitor 5 of FIG. 1.

Referring now to FIG. 1, a series circuit of a PNP transistor 3 and a diode 4 is disposed in a charge-up path, through which a first capacitor 5 is fed with electric charges from a second DC power supply 2. A resistor 10 for biassing is connected between the base of the PNP transistor 3 and the negative terminal of the power supply 2. The first capacitor 5 is charged up by turning on an IGBT 9 (FIG. 2(a)) in the state that electric charges are not accumulated in the capacitor 5 as shown in FIG. 2(c). Since the capacitor 5 is charged up through the PNP transistor 3, the charge-up current of the capacitor 5 is kept at a constant value by the PNP transistor 3 and its base resistance until the voltage across the capacitor 5 rises to almost the same value with the voltage of the second power supply 2, as shown in FIG. 2(b). The voltage across the capacitor 5 rises linearly. The charge-up current I of the capacitor 5 is expressed by equation 1.

$$I = h_{FE} \times E_2 / R_{10} \tag{1}$$

Here, $h_{FE}$ represents a current amplification factor of the PNP transistor 3; $E_2$ is the voltage (V) of the second DC power supply 2; and $R_{10}$ is the resistance ($\Omega$) of the resistor 10. And, the charge-up current $V_c$ of the first capacitor 5 is expressed by equation 2.

$$V_c = \times t / C \tag{2}$$

Here, t represents a charge-up period, and C is a capacitance of the first capacitor.

Figure 3:
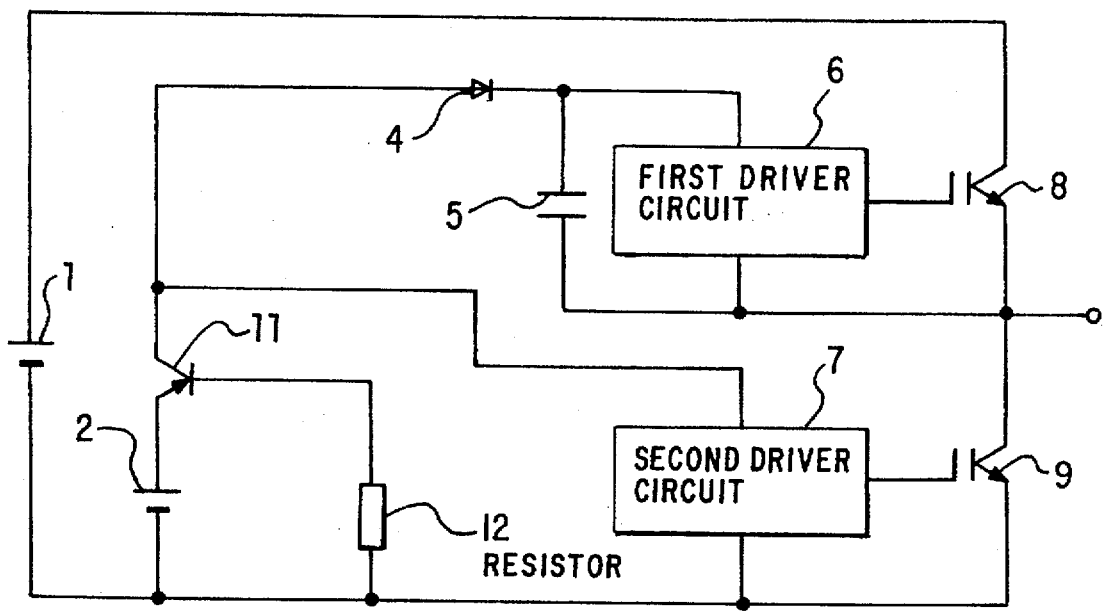
FIG. 3 is a circuit diagram of a second embodiment of a driver circuit for an inverter according to the present invention.

FIG. 3 is a circuit diagram of a second embodiment of a driver circuit for an inverter according to the present invention. In FIG. 3, a diode 4 is disposed in a charge-up path of a first capacitor 5. A PNP transistor 11 is connected between the positive terminal of a second DC power supply 2 and a common connection point of the charge-up path and a power supply path, through which a second driver circuit 7 is supplied with electric power from the second DC power supply 2. And, a resistor 12 for biassing is connected between the base of the PNP transistor 11 and the negative terminal of the second DC power supply 2.

While the voltage of the second DC power supply 2 is rising, the currents flowing to the first capacitor 5 and the second driver circuit 7 are suppressed by the PNP transistor 11 and its base resistance. The sum of the suppressed currents is the rising voltage E2 in equation 1 of the second DC power supply 2. Thus, by suppressing the currents flowing to the first capacitor 5 and the second driver circuit 7, it is possible to smoothly raise the voltage of the second DC power supply 2.

Figure 4:
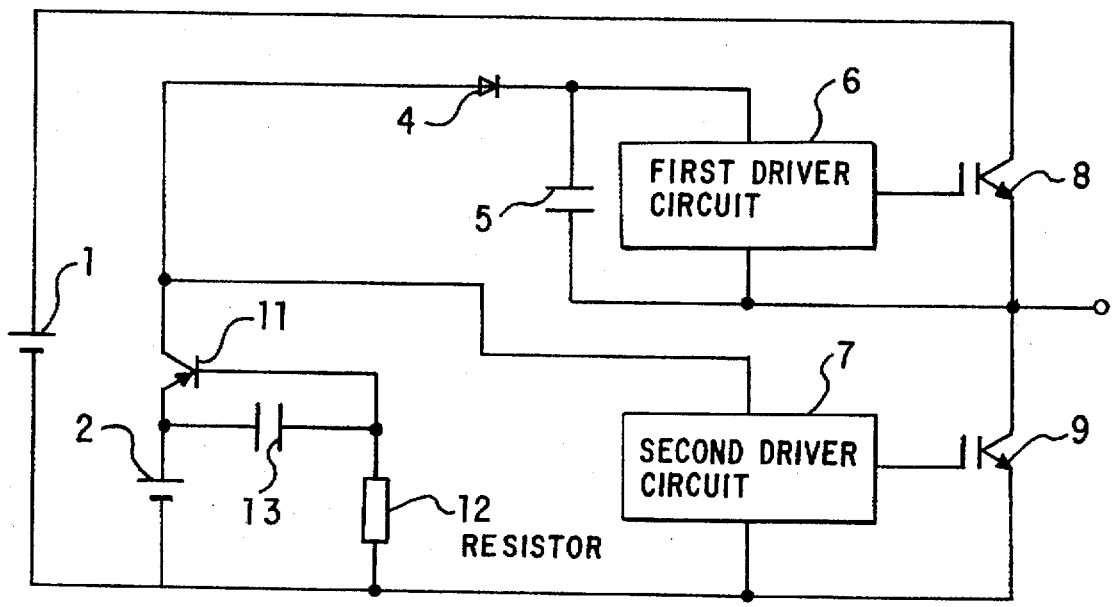
FIG. 4 is a circuit diagram of a third embodiment of a driver circuit for an inverter according to the present invention.
Figure 5A:
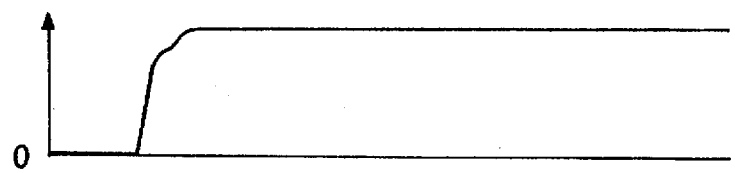
FIG. 5(a) is a wave form of a voltage of a first DC power supply of FIG. 4.
Figure 5B:
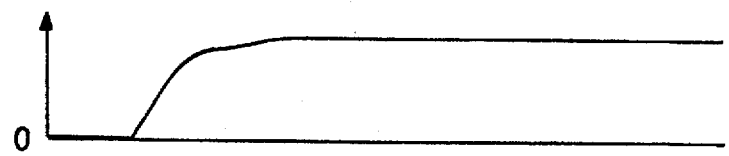
FIG. 5(b) is a wave form of a voltage of a second DC power supply of FIG. 4.
Figure 5C:
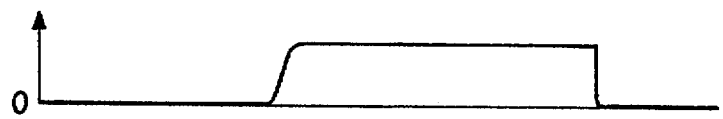
FIG. 5(c) is a wave form of a base current of a PNP transistor of FIG. 4.

FIG. 4 is a circuit diagram of a third embodiment of the driver circuit for an inverter according to the present invention. FIG. 5(a) is a wave form of the voltage of a first DC power supply of FIG. 4. FIG. 5(b) is a wave form of the voltage of a second DC power supply of FIG. 4. And, FIG. 5(c) is a wave form of the base current of a PNP transistor of FIG. 4.

Referring now to FIG. 4, a diode 4 is disposed in the charge-up path of a first capacitor 5. A PNP transistor 11 is connected between the positive terminal of a second DC power supply 2 and a common connection point of the charge-up path and a power supply path through which a second driver circuit 7 is supplied with electric power from the second power supply 2. A resistor 12 for biassing is connected between the base of the PNP transistor 11 and the negative terminal of the second DC power supply 2. And, a second capacitor 13 is connected between the base terminal and the emitter terminal of the PNP transistor 11.

As the voltage of the first DC power supply 1 rises as shown in FIG. 5(a), the voltage of the second DC power supply 2 rises as shown in FIG. 5(b). In this situation, the bias current of the PNP transistor 11 bypasses the PNP transistor 11 through the second capacitor 13, and the PNP transistor 11 is kept at its OFF-state. As the charge-up voltage of the capacitor 13 rises after the voltage of the second DC power supply 2 has risen, a bias current flows to the base of the PNP transistor 11 as shown in FIG. 5(c) and the PNP transistor 11 is turned on. By selecting the time constant determined by the resistance of the resistor 12 and the capacitance of the capacitor 13 at a certain value, electric power is not supplied to the first capacitor 5 and the second driver circuit 7 for an unstable period while the voltage of the second DC power supply is rising, so that the voltage rise of the second DC power supply 2 is stabilized.

In the embodiments described above, the second switching element 9 is turned on for a predetermined time, e.g. for several second at the initial charging of the first capacitor 5, so that the charging is completed while the charge-up current for the first capacitor 5 is suppressed. Thus, it is possible to operate the driver circuit for an inverter.

According to the present invention, the problems caused during the voltage rise of the second DC power supply have been solved by disposing a charge-up current suppressor circuit formed of a transistor etc. in the charge-up path between the second DC power supply and the first capacitor. By the provision of the charge-up current suppressor circuit, it is possible to conduct the initial charge-up of the first capacitor by a simple circuit, wherein the second switching element is turned on for a predetermined period of time.

What is claimed is:

1. A driver circuit for an inverter comprising:
    a switching circuit formed of a first switching element and a second switching element connected in series, said first and second switching elements being turned on and off in complementary with one another;
    a first DC power supply connected parallel to said switching circuit;
    a first driver circuit connected to said first switching element for driving the same;
    a second driver circuit connected to said second switching element for driving the same;
    a second DC power supply connected to the second driver circuit for supplying electric power to said second driver circuit;
    a first capacitor connected to the first driver circuit and having a charge-up path communicating with the second DC power supply, said first capacitor, during an ON-period of said second switching element, being charged up through the second DC power supply for supplying electric power to said first driver circuit, said charge-up path from the second DC power supply having a connecting point to which the second driver circuit is connected;
    a series circuit formed of a PNP transistor and a diode and disposed in said charge-up path between the connecting point and the first capacitor; and
    a resistor connected between a base of said PNP transistor and a negative terminal of said second DC power supply, said resistor and the PNP transistor keeping electric current being charged at a constant value.

2. A driver circuit according to claim 1, wherein said second switching element is turned on during a predetermined period of time at an initial charge-up of said first capacitor.

3. A driver circuit according to claim 1, wherein said electric current being charged is kept constant until voltage on both sides of the first capacitor becomes substantially same as that of the second DC power supply.

4. A driver circuit for an inverter comprising:
    a switching circuit formed of a first switching element and a second switching element connected in series, said first and second switching elements being turned on and off in complementary with one another;
    a first DC power supply connected parallel to said switching circuit;
    a first driver circuit connected to said first switching element for driving the same;
    a second driver circuit connected to said second switching element for driving the same;
    a second DC power supply connected to the second driver circuit for supplying electric power to said second driver circuit;
    a first capacitor connected to the first driver circuit and having a charge-up path communicating with the second DC power supply, said first capacitor, during an ON-period of said second switching element, being charged up through the second DC power supply for supplying electric power to said first driver circuit, said charge-up path from the second DC power supply having a connecting point to which the second driver circuit is connected;
    a series circuit disposed in said charge-up path and formed of a PNP transistor disposed between a positive terminal of the second DC power supply and the connecting point, and a diode disposed between the connecting point and the first capacitor; and
    a resistor connected between a base of said PNP transistor and a negative terminal of said second DC power supply, said resistor and the PNP transistor suppressing current flowing to the first capacitor and the second driver circuit while voltage of the second DC power supply is rising.

5. A driver circuit for an inverter comprising:
    a switching circuit formed of a first switching element and a second switching element connected in series, said first and second switching elements being turned on and off in complementary with one another;
    a first DC power supply connected parallel to said switching circuit;
    a first driver circuit connected to said first switching element for driving the same;
    a second driver circuit connected to said second switching element for driving the same;
    a second DC power supply connected to the second driver circuit for supplying electric power to said second driver circuit;
    a first capacitor connected to the first driver circuit and having a charge-up path communicating with the second DC power supply, said first capacitor, during an ON-period of said second switching element, being charged up through the second DC power supply for supplying electric power to said first driver circuit, said charge-up path extending from the second DC power supply having a connecting point to which the second driver circuit is connected;
    a series circuit disposed in said charge-up path and formed of a PNP transistor disposed between a positive terminal of the second DC power supply and the connecting point, and a diode disposed between the connecting point and the first capacitor;
    a resistor connected between a base of said PNP transistor and a negative terminal of said second DC power supply; and
    a second capacitor connected between an emitter terminal and the base terminal of the PNP transistor, limited value of electric current from the second DC power supply being supplied to the first capacitor and the second driver circuit when the second DC power supply rises.

6. A driver circuit according to claim 5, wherein said resistor, the PNP transistor and the second capacitor prevent current flowing to the first capacitor and the second driver circuit while voltage of the second DC power supply is rising.

* * * * *

UNITED STATES PATENT AND TRADEMARK OFFICE
CERTIFICATE OF CORRECTION

PATENT NO. : 5,684,687
DATED : November 4, 1997
INVENTOR(S) : Takao Ichihara

It is certified that error appears in the above-indentified patent and that said Letters Patent is hereby corrected as shown below:

On the cover page, Abstract's section, line 17, change "and are" to --is--;

In column 4, line 10, change "$V_C = xt/C$" to --$V_C = I \times t/C$--;

In column 5, line 3, change "second" to --seconds--; and

In column 6, line 63, after "current" add --from--.

Signed and Sealed this

Twenty-first Day of April, 1998

Attest:

BRUCE LEHMAN

*Attesting Officer*       *Commissioner of Patents and Trademarks*